(12) United States Patent
Hu et al.

(10) Patent No.: US 6,501,260 B1
(45) Date of Patent: Dec. 31, 2002

(54) BAR TESTER

(75) Inventors: Martin Hu, Corning, NY (US); Herve P. LeBlanc, Painted Post, NY (US); Ronald L. Waters, Mansfield, PA (US); Chung-En Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/738,108

(22) Filed: Dec. 15, 2000

(51) Int. Cl.[7] .......................... G01R 1/04; G01R 31/26; G01R 31/02
(52) U.S. Cl. ..................... 324/158.1; 324/765; 324/754
(58) Field of Search ................ 324/158.1, 765, 324/754, 767

(56) References Cited

U.S. PATENT DOCUMENTS

| | | | |
|---|---|---|---|
| 4,795,976 A | 1/1989 | Pawlik ........................ 324/158 |
| 5,293,516 A | 3/1994 | Fouere et al. ................ 324/158 |
| 5,454,002 A * | 9/1995 | McCann ....................... 372/36 |
| 5,498,973 A | 3/1996 | Cavaliere et al. ........... 324/765 |
| 5,550,480 A | 8/1996 | Nelson et al. ............... 324/754 |
| 5,629,097 A * | 5/1997 | McCann ....................... 428/594 |
| 5,777,485 A | 7/1998 | Tanaka et al. ............... 324/757 |
| 5,939,852 A * | 8/1999 | Akutsu et al. ............... 318/640 |
| 5,989,932 A | 11/1999 | Freund et al. ................ 438/29 |
| 6,122,307 A | 9/2000 | Koseki ........................ 372/107 |
| 6,137,305 A | 10/2000 | Freund et al. .............. 324/767 |
| 6,248,604 B1 * | 6/2001 | Eng et al. .................... 324/765 |

OTHER PUBLICATIONS

G.P. Agrawal et al., "Long–Wavelength Semiconductor Lasers", AT&T Bell Laboratories,Van Nostrand Reinhold Company, NY, pp. 61–63 No date available.

* cited by examiner

Primary Examiner—Kamand Cuneo
Assistant Examiner—Jermele M. Hollington
(74) Attorney, Agent, or Firm—Juliana Agon

(57) ABSTRACT

A tester for characterizing individual ones of a semiconductor laser devices of a laser bar includes a holder for securing the laser bar in a fixed position. For moving in at least one relative direction with respect to the laser bar, a movable measurement system is provided for characterizing the individual ones of the semiconductor laser devices as a function of the at least one relative direction.

8 Claims, 4 Drawing Sheets

BAR TESTER

BACKGROUND OF THE INVENTION

1. Field of the Invention

The present invention relates generally to testing of semiconductors, and particularly to testing of laser bars, which are an intermediate structure in the manufacture of laser devices.

2. Technical Background

Laser devices, such as semiconductor diode lasers or laser chips, have become important commercial components. They are used in a wide variety of applications ranging from the readout sources in compact disks to the transmitters in optical fiber communication systems. While new applications in high-speed telecommunication networks continue to emerge, how to ensure that diode lasers are reliable and manufacturable is the most challenging issue. One proven approach to this issue is to deploy tight quality control by using laser bar testing systems that characterize diode lasers in many aspects and in an efficient manner.

Diode lasers are manufactured on wafers or substrates which are processed and further divided into sections or quarters. The sections are further divided into laser bars by breaking or cleaving the sections along the scribe lines, to form facets along the elongated sides of the sections. The laser bar contain many laser diodes.

During the process of diode laser fabrication from the wafer to the final packaging of individual laser devices or diodes, the first stage where these lasers exhibit both electrical and optical characteristics is when laser bars are formed. Therefore, it is desired to characterize lasers at this early stage by probing and testing all the lasers when they are still in the form of a laser bar. The laser devices that do not meet specifications will be scrapped before entering into further labor-costing or time-costing stages, i.e. packaging and life-testing or burn-in. Usually, a full procedure of bar testing includes six measurements for each laser that is being probed: front-facet light versus current, back-facet light versus current, voltage versus current, horizontal far field pattern, vertical far field pattern and an optical spectrum analysis. A system that performs one or all of these measurement functions is called a laser bar tester.

In a conventional laser bar tester, after a laser bar holder or chuck has been removed to load/unload laser bars at a remote station, the laser bar and a single long contact probe are mounted on a rotational stage and detectors are scattered around the laser bar. In order to make a specific measurement, i.e. light versus current, the laser under test or the selected laser device and the probe have to rotate to face one particular detector with the probe engaged. Thus testing of all characteristics involves moving the laser bar and probe many times. This mechanism enabling multiple movements of the probe and the laser bar is prone to vibration that can cause the lift-off of the probe from the laser surface of the selected laser device, potentially damaging the laser because of transient electrical discharges during or in-between measurements.

Therefore, there is a need to improve the laser bar tester to minimize damage to the laser devices due to the testing process while maximizing efficiency.

SUMMARY OF THE INVENTION

One aspect of the present invention is a tester for characterizing individual ones of a semiconductor laser devices of a laser bar, wherein the tester includes a holder for securing the laser bar in a fixed position. For moving in at least one relative direction with respect to the laser bar, a movable measurement system is provided for characterizing the individual ones of the semiconductor laser devices as a function of the at least one relative direction.

In another aspect, the present invention includes a pair of detectors, each moving in arc paths around the laser bar to sample the far-fields.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention and are intended to provide an overview or framework for understanding the nature and character of the invention as it is claimed. The accompanying drawings are included to provide a further understanding of the invention and are incorporated in and constitute a part of this specification. The drawings illustrate various embodiments of the invention and together with the description serve to explain the principles and operation of the invention.

DETAILED DESCRIPTION OF THE PREFERRED EMBODIMIENTS

Figure 1:
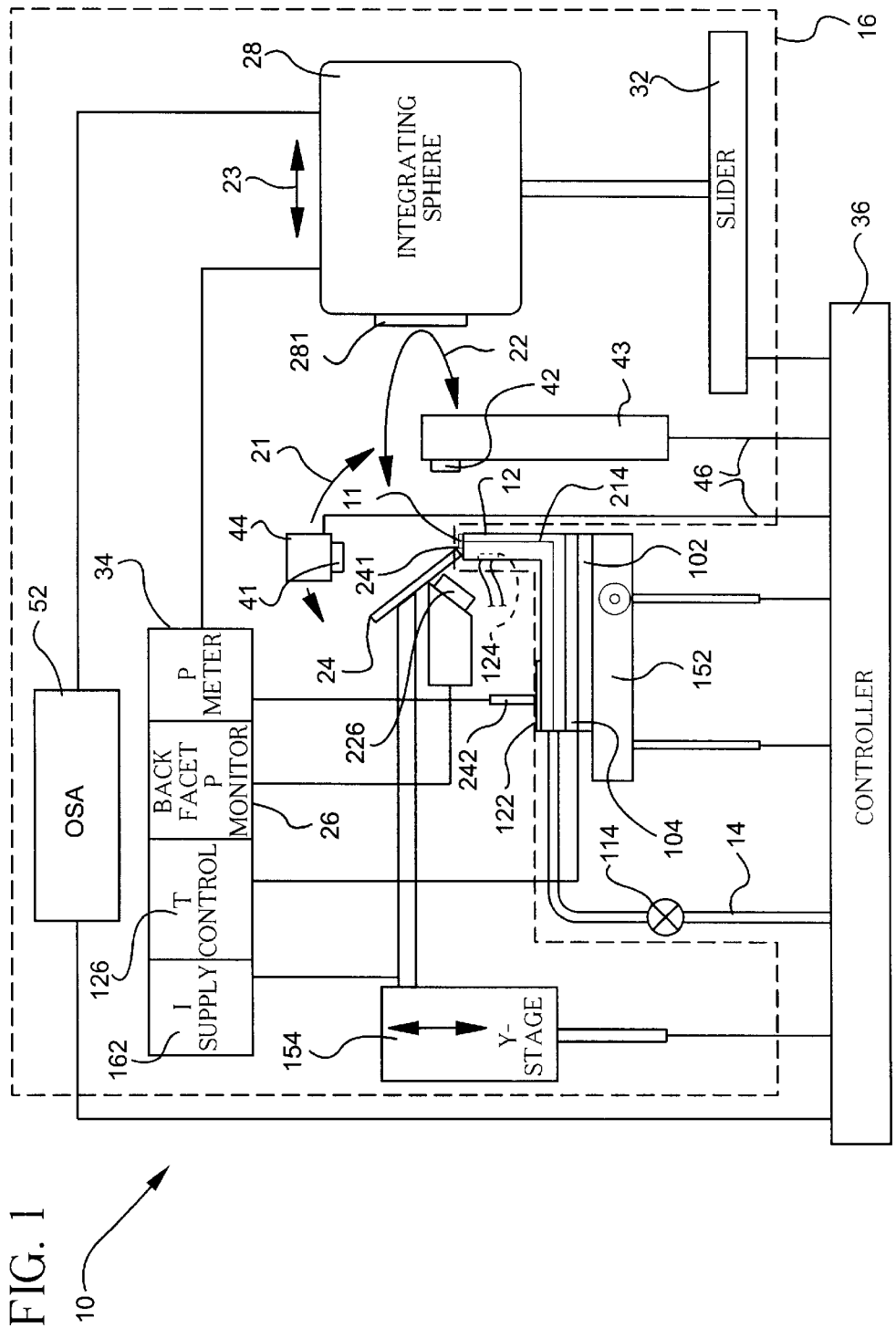
FIG. 1 is a schematic view of a laser bar tester, in accordance with the present invention.

A laser bar tester that characterizes laser bars in all categories in a fast and accurate manner is taught. Additionally, this laser bar tester system is also compact in size. The laser bar testing system includes a fixture for holding the laser bar, a mechanism for probing individual lasers, and individual measurement modules.

Reference will now be made in detail to the present preferred embodiment of the invention an example of which is illustrated in the accompanying drawings. Wherever possible, the same reference numbers will be used throughout the drawings to refer to the same or like parts. An exemplar embodiment of the bar tester of the present invention is shown in FIG. 1, and is designated generally throughout by reference numeral 10.

In accordance with the invention, the present invention for a tester and method for characterizing individual ones of a semiconductor laser devices of a laser bar 11 includes a holder 12 for securing the laser bar in a fixed position. The advantages of a fixed laser bar mounting is the minimization of testing errors due to the movement of the laser bar 11. Even though only one example is shown, other movable detector systems surrounding a fixed laser bar can be implemented, in accordance with the teachings of the present invention.

As embodied herein as one example out of other various fixed holder arrangements and depicted in FIG. 1, the holder 12 includes a selective application of vacuum suction 14 applied to the laser bar 11 abutted against a suitable fixture, such as a vacuum chuck, for releasing or securing the laser bar 11 in its fixture. Other fixed holder arrangements could include clamping or other mounting applications to form a fixed reference for measurement purposes.

In accordance with the invention, the present invention for the bar tester 10 may further include a movable measurement system 16 for moving in at least one relative direction 21, 22, 23 with respect to the laser bar 11 for characterizing the individual ones of the semiconductor laser devices as a function of the at least one relative direction 21, 22, 23. The movable measurement system 16 minimizes alignment and tolerance problems and provides a fast, flexible, and accurate characterization of the laser bar 11.

Figure 2:
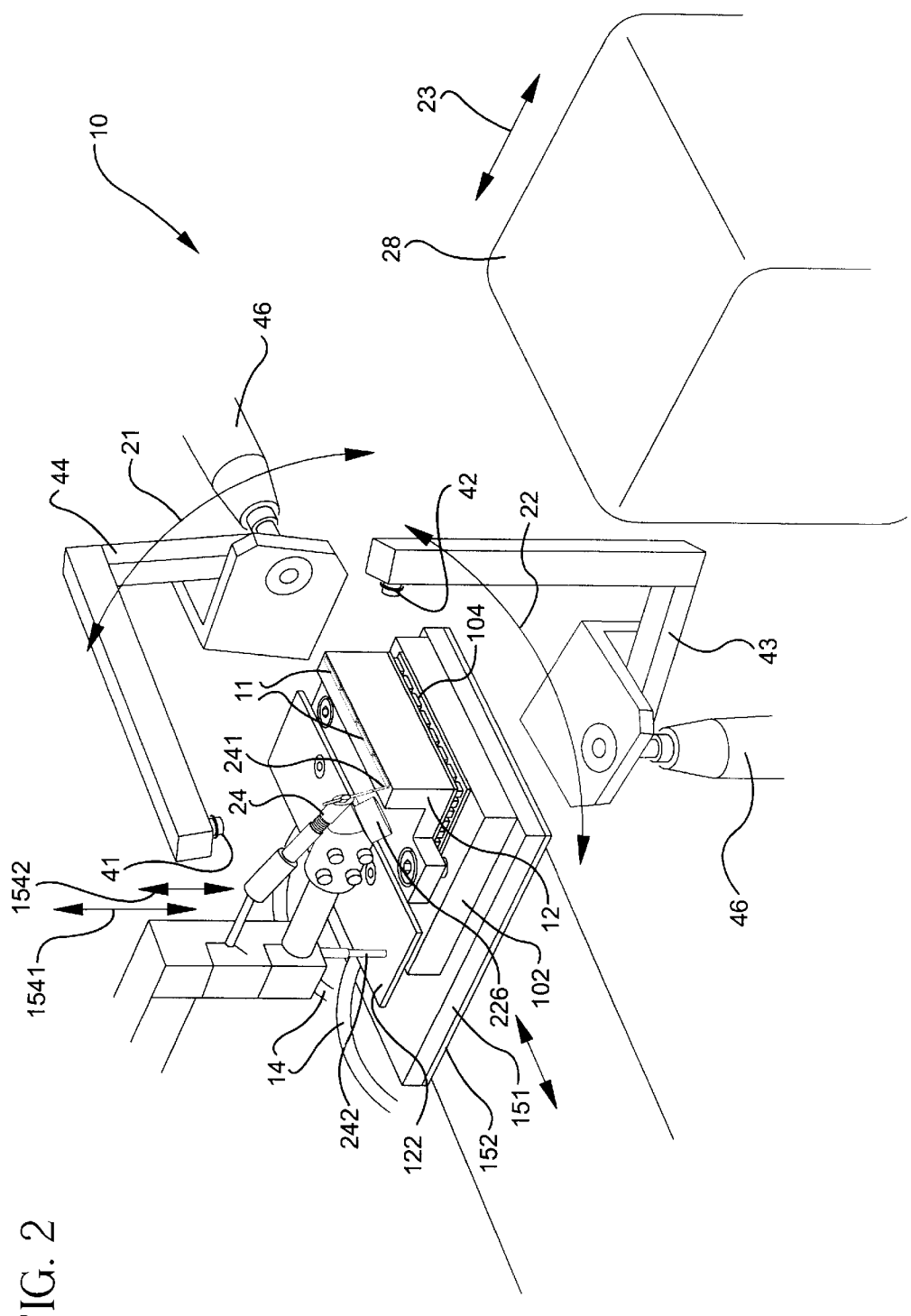
FIG. 2 is a blow-up perspective portion of the vacuum held and temperature controlled laser bar assembly, held laser bar, and prober of FIG. 1, with reference to the far-field scans of FIG. 1, in accordance with the present invention.

As embodied herein, and depicted in FIG. 1, the movable measurement system 16 includes a prober or probing fixture 24 for selectively probing a selected laser device of the laser bar 11 in a selected fixed position defined by the probed position. The movable measurement system 16 further includes a first detector, in the form of a photodetector or back-facet power detector 226 feeding signals to a back-facet power monitor module 26. As seen in FIG. 2, this first detector 226 is preferably mounted with the prober 24 in a fixed relative position with the selected laser device for collecting a back-facet power measurement of the laser device.

As part of the movable measurement system 16 a slidable integrating sphere 28 is connected to a slider 32 for laterally moving in the horizontal direction 23, towards the selected laser device for collecting a front-facet power measurement as measured by a power meter 34 whose power measurements are integrated by the sphere 28. For compiling the front-facet power measurement as a function of the distance of the slidable integrating sphere 28 to the selected laser device and for characterizing the front-facet power measurement against the back-facet power measurement, a controller 36 is preferably used to automatically control, by programmable computer software, the sequencing or indexing and movements of the measurement system and of the initially aligned position of selective laser device of the laser bar 11 in a controlled temperature environment.

Figure 3:
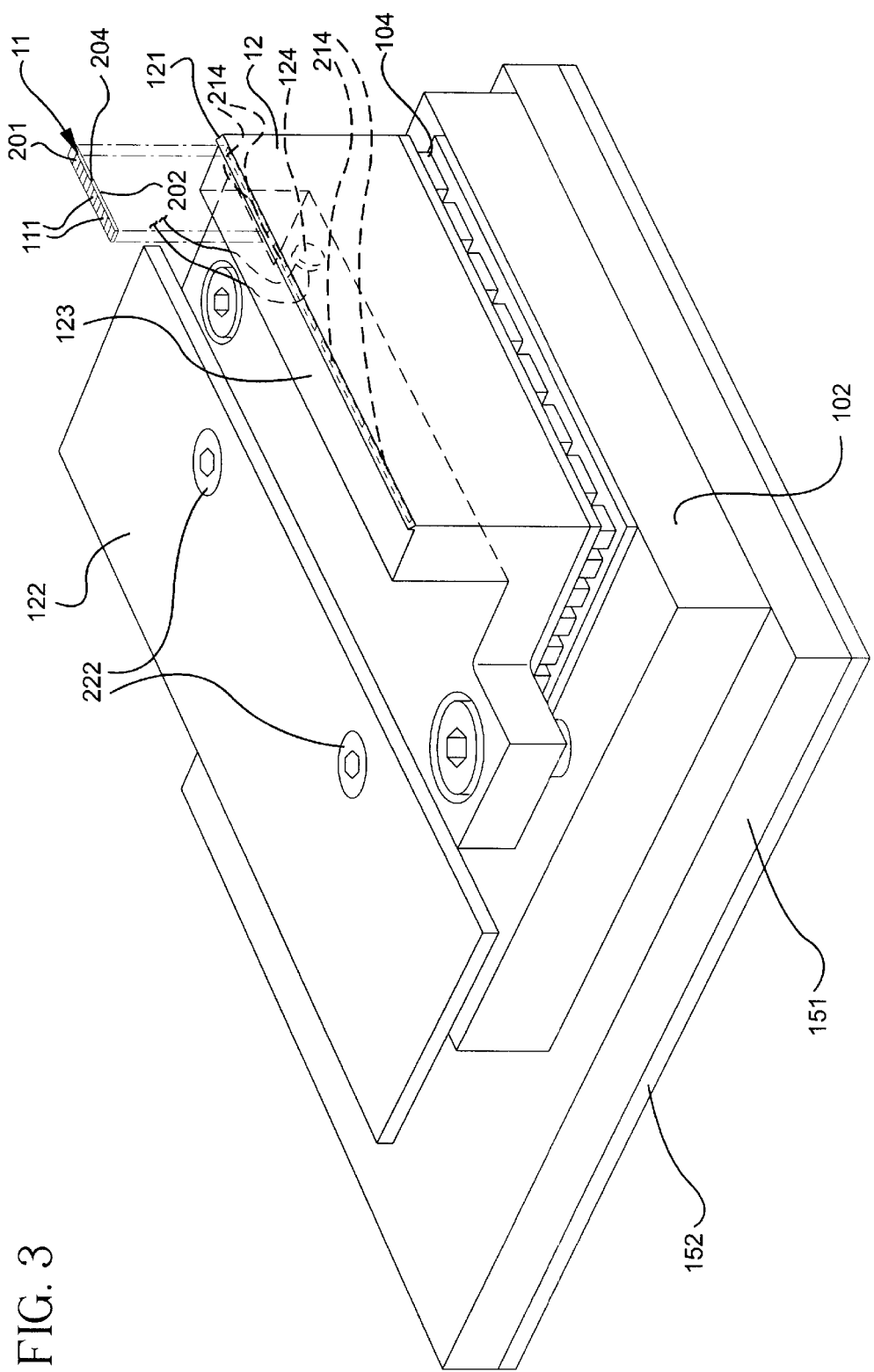
FIG. 3 is a blow-up perspective portion of the vacuum held and temperature controlled laser bar assembly and laser bar of FIG. 2, in accordance with the present invention.
Figure 4:
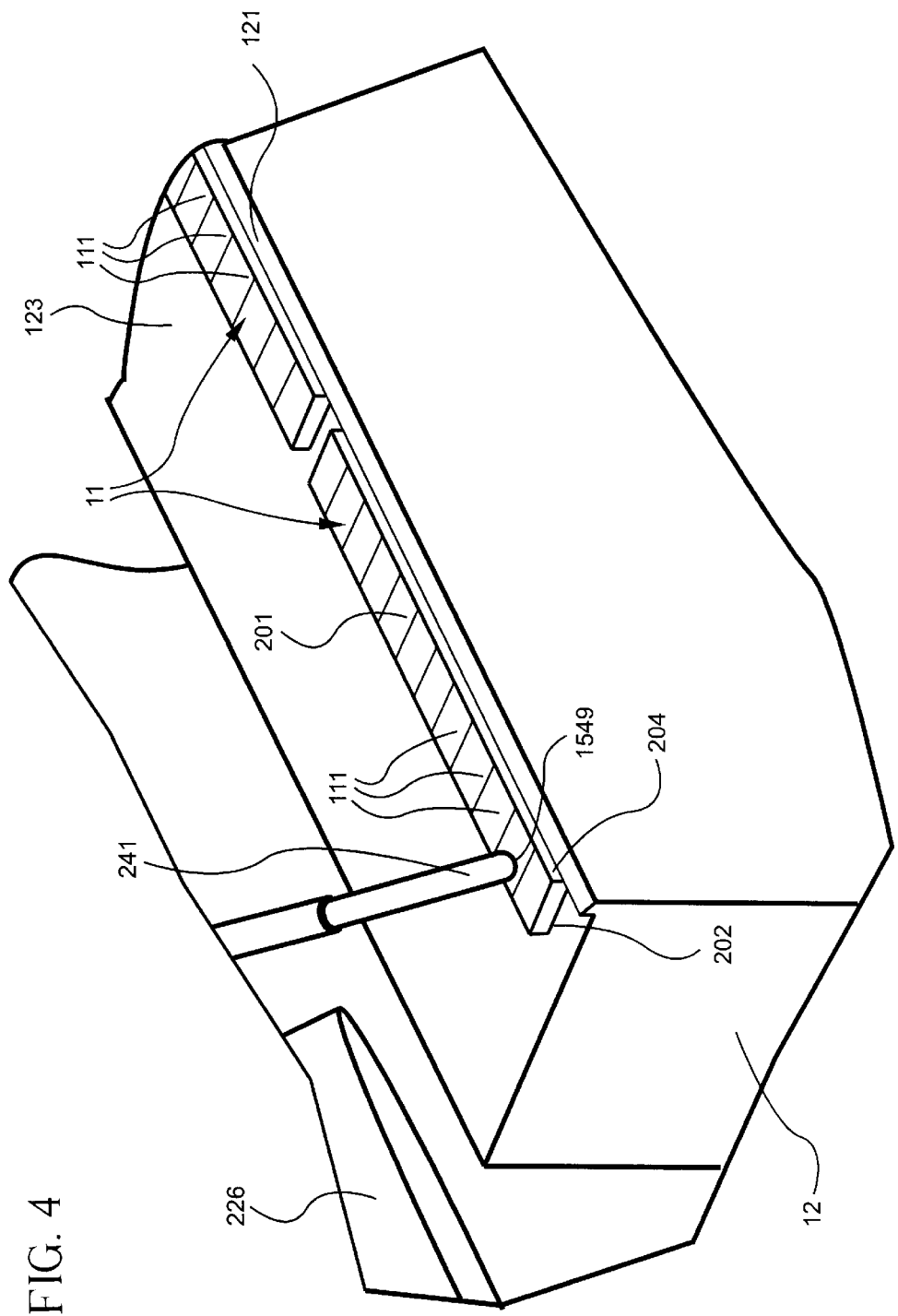
FIG. 4 is a blow-up perspective drawing of the vertically movable probe pin 241 of FIG. 3 for contacting the selected laser device at the preselected indexed position, in accordance with the present invention.

The same movable measurement system 16 is capable of making all other optical measurements by selectively using appropriate detectors and moving the detectors around the a selected laser device 111 of the laser bar 11, as seen in FIGS. 2–4 to make the desired measurement. For example, as seen in FIGS. 1–2, a pair of second detectors 41 and 42 is further provided for collecting a far-field power measurement of the selected laser device. A first motor-driven arm 43 moves a first one 42 of the pair of second detectors in a horizontal arc path 22 relative to the selected laser device to sample the horizontal far-field. Similarly, a second motor-driven arm 44 moves a second one 41 of the pair of second detectors in a vertical arc path 21 relative to the selected laser device to sample the vertical far-field. A programmable motor or another suitable motion controller 46 actuates the arms 43 and 44. However, the arms 43 and 44 can be moved by other electrical or mechanical mechanisms.

As another example of further measurement capabilities, an optical spectrum analyzer (OSA) 52 is connected to the integrating sphere 28 and the controller 36 for providing further optical spectrum analysis, as seen in FIG. 1. Optical spectrum is preferably measured using a miniature fiber spectrometer based on the CCD-array silicon detector and fixed grating technology for keeping the cost of the spectrometer low while providing a reliable and sensitivive spectrometer. To measure weak optical signals the miniature spectrometer is configured to collect data using a long integration period. In the measurement system 16 of the present invention, pulsed optical signals of 5 mW peak power with 0.2% duty cycle have been measured. Because an A/D card is used to sample the signal from the CCD array, the speed is much faster than conventional spectrometers based on rotating gratings. Different miniature spectrometers may also be used for lasers operated at different wavelengths.

To complete the optical spectrum analysis, the measurement system 16 automatically records wavelength of the lasers at different current levels programably supplied by a current supply 162.

Referring to FIGS. 1–4, an enlargement of the laser bar 11 of FIG. 1 is shown in FIGS. 2–4 with reference to particular portions of the measurement system 16 of FIG. 1. A properly designed bar fixture provides a method of easy loading and unloading laser bars, a method of providing good electrical conductivity and a method of controlling temperature.

To provide a more accurate laser bar measurement system, the temperature is controlled and monitored as close to the laser bar 11 as possible. A reference of portions of the laser bar, in its vacuum holder 12, to portions of the measurement system 16 is first described to show where the measurements are referenced-off or indexed from. As seen in FIGS. 3–4, the P-contact surface 201 of the laser bar 11 is facing upward for the prober 24 to access. The output side or a laser emitting facet 204 of the laser bar 11 is near a stop block feature 121 located on top of a base portion 123 of the holder 12 of FIG. 1 for facilitating bar alignment while enabling measurements, such as the far-field scans along the arc paths 21 and 22 as seen in FIG. 2.

A first one of a pair of probes of the prober 24, the signal probe or probe tip 241, preferably flexible, makes contact to the top surface 201 of the laser bar 11, as seen in FIGS. 1–2. This single reference point of the probe tip 241 will be used as the fixed reference for all optical measurements.

The other probe a ground probe 242, makes contact to a striker plate 122 as the electrical ground. For greater flexibility in case the surfaces of the laser bar 11 is uneven the probes 241 and 242 are preferably each in the form of a flexible pin, such as a pogo-pin. One advantage of having such a double-probe design is the minimization of microwave reflection when doing pulsed current operation for certain laser bar testing measurements.

Referring to FIG. 3, the striker plate 122 is on the opposite side of the stop block feature 121 to mount the bar 11 in the holder 12 between the elevated stop block feature 121 and the striker plate 122. Plated with a layer of gold for good electrical conductivity, the striker plate 122 is physically and electrically attached to the base portion 123 of the holder by screws 222. An advantage of using a separate striker plate, other than the base portion 123 of the holder for probing, is that a smaller worn-out striker plate need only be replaced instead of a complete, bigger, and more complexed holder 12.

The N-contact 202 of the laser bar 11 is electrically and thermally grounded to the base portion 123 of the holder 12, preferably implemented as a gold plated fixture. A thermoelectric (TE) cooler 104 and a heat sink 102 are added underneath the vacuum holder 12 to control the temperature surrounding the bar 11 under testing, as seen in FIGS. 1–3.

Referring also to FIG. 4, the temperature is monitored with the temperature controller module 126 fed by the thermal signals picked-up by a thermal sensor 124 mounted inside the holder 21 for feeding-back temperature near the laser bar 11. Preferably, the temperature is controlled by a computer module referenced as the temperature controller 126, for regulating the testing temperature in the range of −20 to 80 degrees C.

To provide a fixed and indexable position for the laser bar 11, the vaccuum holder 12 for the bar 11 of FIG. 1 is shown in more detail in FIGS. 2–3. The laser bar 11 is preferably held by the vaccuum suction 14 applied through a vacuum slot 214 in the base portion 123 of the holder or fixture 12. By turning or activating the vacuum switch 114 of FIG. 1 "ON" or "OFF", as controlled by the controller 36, the bar 11 can be easily loaded to or unloaded from the holder 12. Preferably, four bars 11 are mounted at the same time thus, down-time due to loading/unload is minimized. For simplicity, only one bar 11 is shown in FIG. 3.

The front edge of the vacuum holder 12 has a triangular-shaped protrusion used as a stop block feature 121 to position the laser bar 1 on the output side 204. An appropriately designed tool (not shown) pushes the bar 11 against the stop block portion 121 of the holder and aligns the bar 11 into an indexable position on top of the base portion 123 of the holder. The height of the stop block portion 121 is preferably designed such that the active top region of the bar 11 is about 50 $\mu$m above the top point of the stop block 121 to protect the laser bar from contact damage. Bars 11 are loaded to the testing system 16 in situ or in process that is the chuck or holder 12 is not relocated to a remote location for loading/unloading. This in situ procedure not only minimizes the down time of the system but also allows automatic loading/unloading.

Referring to FIGS. 1–4 the individual lasers 111 on the bar 11 are indexed by a probing mechanism or system consisting of a horizontal motorized X-stage 152 which is supporting the laser bar holder 12 above through the use of an adapter plate 151 that is mounted to the X stage 152 and the prober 24, already described having dual probes in a probe tip assembly, including a back-facet power monitor, that is connected to a vertical motorized Y-stage 154. Controlled by the motion controller 36, the X stage 152 horizontally moves the laser bar 11 which is placed on top of the X stage 152, as seen in FIGS. 1–2. To move individual lasers 111 of the bar 11 into or out from the indexed measurement position, the horizontal X-stage 152 translates the bar fixture or holder 12 with respect to the tip of the signal probe or probe tip 241. While a laser 111 is in the measurement position the vertical stage 154 lowers the probe tip 241 to make the electrical contact and measurements are taken. After a laser 111 is fully characterized, the vertical stage 154 of FIG. 1 raises the probe tip 241 off the laser surface 201 and waits for the next laser to move in. Also controlled by the motion controller 36, the vertical stage 154 is raised and lowered every time a specific laser 111, one of the many lasers 111 on the bar 11, is translated or indexed next underneath the probe tip 241 for testing. The probe tip, as part of the prober 24, is attached only to the Y stage 154 for minimizing the movement of the laser bar 11. Once a laser 111 is moved underneath the probe tip 241, the prober 24 is lowered to make contact and all the other detectors move around that particular laser 111 for various measurements. This procedure repeats itself until all the lasers 111 on the bar 11 are characterized.

One of the key issues in probing is how to avoid scratching the laser surface 201 by the probe tip 241. The probing system manages to create no scratch marks by using an inventive step-and-check or step-approximation approach. The software in the controller 36 that controls the probing system moves the vertical stage 154 towards the top laser bar surface 201 in small increments or small steps 1541 that get even smaller 1542 as the expected contact is approached, as seen in FIG. 2. Preferably, the testing software is facilitated by the controller 36, implementable using a Pentium computer, and an ILX Lightwave semiconductor laser controller, that is also capable of performing optical tests, in the form of various modules 162, 126, 26, and 34, as seen in FIG. 1. At each increment, the software in the controller 36 checks if there exists a close electrical loop between the laser bar 11 and the associated electronic instrument, such as whether the current supply 162 can pass a current to enable the current to be read. A contact position 1549, as seen in the magnified representation of FIG. 2 in FIG. 4, is obtained when such a close loop is found, for example, when a current measurement can be read. The controlling software in the controller 36 also calculates the parameters of the bar surface plane, such as the location of the next expected contact point, based on lasers 111 that have been successfully probed; these parameters are used to help obtain a faster contacting approach time for the rest of the lasers 111 on the bar 11. This step-wise contacting approach also allows successful probing on rough or uneven laser bar surfaces.

Referring back to FIG. 1, all of the other detectors such as the OSA 52, the slider 32 for the integrating sphere 28 are also aligned to the position where the probe tip 241 is lowered for making contact with a laser 111. This position was determined when the system was initially setup. Each of many individual lasers 111 on a bar 11, is moved to that same initial setup position for test. Therefore, the proper alignment of individual laser 111 with all the detectors is preserved.

For all optical measurements the contacted laser bar 11 and the contacting probe tip 241 are maintained still in a fixed position. The optical measurements obtained include the most important characteristics for semiconductor diode lasers, such as the threshhold current measurable by knowing the value of the current supply 162. Other important measurements include turn-on voltage, slope efficiency, series resistance, and front/back power ratio. As one example of an optical measurement, the integration sphere 28 collects the front power. The use of the integration sphere 28 has two advantages: first, it allows measuring high optical power since the optical signal entering the sphere is scattered by the cavity walls and there is only a small portion of light that reaches the photo detector 226 in FIG. 1. Second, the sphere 28 has a relatively large aperture 281 to allow easy coupling of a highly divergent optical signal from the diode laser 111 into the sphere's cavity. The sphere 28 is mounted on the computer controlled motion slider 32 that moves the integration sphere 28 to the lasers 111 when a front-facet power versus current test is performed. The back-facet power is collected by the large-area photo detector 226 (shown in FIG. 2) which is mounted on the probe assembly or prober 24. The detector 226 will not be saturated by a high incident power because the back-facet of the bar 11 is usually high-reflectively coated.

One known issue for weakly guided high-power lasers is the existence of higher-order modes due to spatial hole burning. The occurrence of this effect is usually accompanied by "kinks" on a power or optical invensity versus current (LI) curve. However, the kinks are not obvious and can be very difficult to detect. In accordance with the teachings of the present invention the kink-detection scheme utilizes a reduced aperture to measure a LI curve in order to enhance the occurrence of the kinks by moving in a lateral direction 23 the sphere 28 at a known distance to the laser 111 via the slider 32. With such a lateral movement of the sphere the measurement system 16 has the capability of continuously varying the numerical aperture 28 by allowing the aperture 281 to vary its distance from the laser 111. A computer program in the controller 36, using a binomial weighted averaging scheme, then processes the LI data to reveal the kinks.

Another example of an optical measurement is the far-field scan which is very important in characterizing beam quality. Far-field patterns are defined as the angular dependence of optical intensity. For example, the far-field characteristics determine the laser-to-fiber coupling efficiency. Usually a semiconductor laser has an elliptical beam shape because the width of a laser waveguide is much larger than the thickness. Therefore a complete characterization of the far-field requires scanning cross the divergent beam along two orthogonal axes 21 and 22.

In accordance with the teachings of the present invention the measurement system 16 uses two mini-motor driven arms 43 and 44 to move two pin-size photo detectors 41 and 42, one on each arm 43 and 44, to sample across both the horizontal and vertical far-fields 21 and 22. An encoder on the motor of the motion controller 46 allows positioning the detectors 41 and 42 with high accuracy (within 0.02 degree) and a preamplifier each in the detectors 41 and 42 guarantees a large dynamic gain range for each of the detectors 41 and 42. The size of each of the detectors 41 and 42 is chosen to be about 100 $\mu$m in diameter, and the distance from one of the detectors 41 or 42 to the laser emitting facet 204 is about 60 mm. The angular far-field resolution is estimated to be about 0.2 degree.

Another application of far-field patterns is for kink-detection. When kink occurs, the far-field patterns become asymmetric. Therefore, far-field measurements can first be taken at different current levels and any changes in the far-field patterns can be associated with kinks. The control software in the controller 36 automatically executes this far-field and kink association procedure.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A tester for characterizing individual ones of a semiconductor laser devices of a laser bar, the tester comprising:
   a holder for securing the laser bar in a fixed position referenced from a fixed reference for measurement purposes; and
   a movable measurement system for moving the measurement system with respect to the fixed reference, wherein the movement of the measurement system is also changed, in at least one relative direction, with respect to the fixed position of the laser bar, for characterizing the individual ones of the semiconductor laser devices as a function of the at least one relative direction.

2. The tester of claim 1 wherein the movable measurement system comprises:
   a prober for selectively probing a selected laser device of the laser bar in the fixed position;
   a first detector mounted with the prober in a fixed relative position with the selected laser device for collecting a back-facet power measurement of the laser device;
   a slidable integrating sphere for laterally moving towards the selected laser device for collecting a front-facet power measurement; and
   a controller for compiling the front-facet power measurement as a function of the distance of the slidable integrating sphere to the selected laser device and for characterizing the front-facet power measurement against the back-facet power measurement.

3. The tester of claim 1 wherein the movable measurement system comprises:
   a prober for selectively probing a selected laser device of the laser bar in a selected fixed position;
   a pair of second detectors for collecting a far-field power measurement of the selected laser device;
   a first motor-driven arm to move a first one of the pair of second detectors in a horizontal arc path relative to the selected laser device to sample the horizontal far-field;
   a second motor-driven arm to move a second one of the pair of second detectors in a vertical arc path relative to the selected laser device to sample the vertical far-field; and
   a motion controller for controlling the movement of at least one of the first and second motor-driven arms to move at least one of the pair of second detectors in the arc path relative to the fixed reference.

4. A method for characterizing individual ones of a semiconductor
   laser devices of a laser bar, the method comprising the steps of:
   providing a fixed reference for measurement purposes;
   securing the laser bar in a fixed position referenced from the fixed reference, wherein
   the securing step comprises the steps of:
   stepping a probe towards the laser bar in a first step size;
   checking to determine if an electrical loop is closed on the laser bar;
   continuing to step the probe continuously in a second step size that is continuously smaller as the previous step size, as expected contact is approximated, toward the laser bar until the electrical loop is closed; and
   contacting the laser bar in the fixed position with the probe and securing the probe in a contact position for closing the electrical loop, wherein the contact position is not moved from the fixed reference and contact is maintained as the fixed reference and as the fixed position for all subsequent optical measurements of the same individual one of the semiconductor laser devices of the laser bar; and
   moving at least one detector to a selected position referenced from the fixed reference, wherein the selected position of the at least one detector is also changed from the fixed position of the laser bar.

5. The method of claim 4 wherein the step of moving includes moving in at least one relative direction with respect to the laser bar for characterizing the individual ones of the semiconductor laser devices as a function of the at least one relative direction.

6. The method of claims 4 wherein the moving step comprises the steps of:

vertically moving a prober for selectively probing a selected laser device of the laser bar in the fixed position;

moving a first detector in a horizontal arc path relative to the selected laser device to sample a horizontal far-field; and moving a second detector in a vertical arc path relative to the selected laser device to sample a vertical far-field.

7. The method of claim 6 wherein the moving step further comprising the steps of:

varying the current supplied to selected laser device during the far-field scans;

analyzing the horizontal far-field and the vertical far-field to find an asymmetry between the scans at varying currents; and associating a kink detection with the asymmetry found.

8. A tester for characterizing individual ones of a semiconductor laser devices of a laser bar, the tester comprising:

a vacuum suction for securing the laser bar while the laser bar is moved horizontally to a preselected indexed position referenced from a fixed reference;

a vacuum held and temperature controlled laser bar assembly for receiving the vacuum suction and holding the laser bar in the fixed position once the selected laser device has been moved horizontally to the preselected indexed position referenced from the fixed reference;

a vertically movable prober for contacting the selected laser device at the preselected indexed position at a contact position, wherein the contact position is not moved from the fixed reference and contact is maintained as the fixed reference and as the fixed position for all subsequent optical measurements of the same individual one of the semiconductor laser devices of the laser bar; wherein the vertically movable prober comprises:

a fixture controllable for providing a vertical movement;

a first probe mounted on the fixture for contacting the selected laser device at the preselected indexed position;

a second probe mounted on the fixture for contacting the vacuum held and temperature controlled laser bar assembly for minimizing microwave reflections; and a detector mounted on the fixture for measuring an optical characteristic of the selected laser device; and at least one movable detector movable from the fixed reference for characterizing the selected laser device as a function of the distance moved by the at least one detector with reference to the preselected indexed position of the selected laser device, wherein the change in distance of the at least one detector from the preselected indexed position of the selected laser device is the same change in distance of the at least one detector from the fixed reference.

* * * * *